(12) United States Patent
Amir et al.

(10) Patent No.: US 6,265,923 B1
(45) Date of Patent: Jul. 24, 2001

(54) DUAL RAIL DYNAMIC FLIP-FLOP WITH SINGLE EVALUATION PATH

(75) Inventors: Chaim Amir, Brookline, MA (US); Gin S. Yee, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/543,372

(22) Filed: Apr. 2, 2000

(51) Int. Cl.$^7$ ..................................... H03K 3/037
(52) U.S. Cl. ............................. 327/218; 327/211
(58) Field of Search ..................... 327/218, 225, 327/200, 201, 208, 210–212, 214; 326/119, 121, 93, 95, 98

(56) References Cited

U.S. PATENT DOCUMENTS

| | | | |
|---|---|---|---|
| 5,661,675 | * 8/1997 | Chin et al. | 327/211 |
| 5,764,089 | * 6/1998 | Partoci et al. | 327/200 |
| 5,774,005 | * 6/1998 | Partovi et al. | 327/211 |
| 5,825,224 | 10/1998 | Klass et al. | 327/200 |
| 6,118,304 | * 9/2000 | Potter et al. | 326/93 |

* cited by examiner

Primary Examiner—Toan Tran
(74) Attorney, Agent, or Firm—William L. Paradice, III

(57) ABSTRACT

A dynamic flip-flop circuit that operates in a pre-charge phase and an evaluation phase allows for implementation of multiple-input logic functions without sacrificing performance by using a single evaluation path to generate its output signals. In one embodiment, the dynamic flip-flop circuit includes input logic that receives a clock signal and one or more data input signals. The clock signal defines the pre-charge phase and the evaluation phase of the flip-flop circuit. The input logic has an output terminal connected to a first output buffer circuit, which in turn drives the flip-flop circuit's Q output signal. The output terminal of the input logic is combined with the clock signal in a logic gate having an output terminal connected to a second output buffer circuit, which in turn drives the flip-flop circuit's complementary output signal $\bar{Q}$. During the pre-charge phase, the input logic forces the Q output signal to a first logic state via the first output buffer, and the logic gate forces the $\bar{Q}$ output signal to logic low via the second output buffer. During the evaluation phase, the input logic generates a logic signal in response to a predetermined logic function of its one or more input signals. The logic signal(s), in turn, drives the Q output signal via the first output buffer, and drives the $\bar{Q}$ output signal to a complementary logic state via the logic gate and second output buffer.

15 Claims, 6 Drawing Sheets

DUAL RAIL DYNAMIC FLIP-FLOP WITH SINGLE EVALUATION PATH

BACKGROUND

1. Field of Invention

This invention relates generally to digital circuits and specifically to dynamic flip-flops.

2. Description of Related Art

Dynamic logic gates operate in two phases: a pre-charge phase and an evaluation phase. During the pre-charge phase, the dynamic logic gate drives its output terminal to a first logic state. Then, during the evaluation phase, the dynamic logic gate causes its output signal to either remain at the first logic state or transition to a second logic state, depending upon the dynamic logic gates' input signal(s). The dynamic logic gate returns its output signal to the first logic state during the next pre-charge phase. By forcing its output signal to the same logic state prior to each evaluation phase, the dynamic logic gate need only allow logic transitions in one direction during the evaluation phase. As a result, the dynamic logic gate may be optimized to favor logic transitions from the first logic state to the second logic state during the evaluation phase, which in turn improves performance over static logic gates which allow logic transitions in both directions, and thus cannot be optimized for logic transitions in one direction.

In the past, static flip-flops were typically used to drive dynamic logic gates. However, in addition to allowing logic transitions in both directions, a static flip-flop provides an output signal that requires a certain amount of time to become stable, and therefore must be synchronized with the two-phase operation of dynamic logic gates. The time and uncertainty involved in synchronizing the output signal of a static flip-flop with the input signal requirements of a dynamic logic gate undesirably limits the performance of dynamic logic.

More recently, a dynamic flip-flop was disclosed in U.S. Pat. No. 5,825,224 issued to Klass and assigned to the assignee of the present invention, that eliminates the time penalty associated using static flip-flops to drive dynamic logic gates. FIG. 1 is a block diagram of a dual-rail dynamic flip-flop 10 of the type disclosed in U.S. Pat. No. 5,825,224, which is incorporated by reference herein. The dynamic flip-flop 10 includes a first input latch 11 with a shut-off circuit 12, a second input latch 13 with a shut-off circuit 14, and output latches 15 and 16. The first and second input latches 11 and 13 are clocked with a clock signal CLK. The first input latch 11 receives a data signal D, and in response thereto provides an output signal to the first output latch 15 via node OUT1. The second input latch 13 receives complementary data signal $\overline{D}$ via inverter INV1, and in response thereto provides an output signal to the second output latch 16 via node OUT2N. The shut-off circuit 12 prevents the first input latch 11 from further sampling signal D when output node OUT2N transitions to logic low, and the shut-off circuit 14 disables the second input latch 13 from further sampling signal $\overline{D}$ when output node OUT1 transitions to logic low. Together, the shut-off circuits 12 and 14 implement edge-triggered data sampling for the dual evaluation paths on node OUT1 and OUT2N, respectively.

Referring also to FIG. 2, when the clock signal CLK is logic low, the dynamic flip-flop circuit 10 is in the pre-charge phase. The input latches 11 and 13 pre-charge their respective output nodes OUT1 and OUT2N to logic high. The logic high level at node OUT1 is inverted by output latch 15, which in turn drives the Q output signal to logic low. The logic high level at node OUT2N is inverted by output latch 16, which in turn drives the $\overline{Q}$ output signal to logic low. On the rising edge of CLK, the dynamic flip-flop 10 enters the evaluation phase. The first input latch 11 samples the data signal D and, in response thereto, causes its output node OUT1 to either remain logic high or to transition to logic low. The output latch 15 inverts the logic state at node OUT1 to generate the Q output signal. Similarly, the second input latch 13 samples the complementary data signal $\overline{D}$ and, in response thereto, causes its output node OUT2N to either remain logic high or to transition to logic low. The output latch 16 inverts the logic state at node OUT2N to generate the $\overline{Q}$ output signal.

FIG. 3 is a schematic diagram of the dynamic flip-flop circuit 10 disclosed in U.S. Pat. No. 5,825,224. The first input latch 11 includes p-channel transistors PC1 and K2, n-channel transistors S1 and N1, and inverters INV2 and INV3, where the transistor S1 and inverters INV2 and INV3 implement the shut-off circuit 12. The second input latch 13 includes p-channel transistors K1 and PC2, n-channel transistors S2 and N2, and inverters INV4 and INV5, where the transistor S2 and inverters INV4 and INV5 implement the shutoff circuit 14. The input latches 11 and 13 share an n-channel transistor EVAL. The first input latch 11 receives the data signal D at the gate of its input transistor N1, and the second input latch 13 receives the complemented data signal $\overline{D}$ via inverter INV1 at the gate of its input transistor N2. The output latch 15 includes an inverter INV6 and a n-channel transistor N3, and the output latch 16 includes an inverter INV7 and a n-channel transistor N4.

During the pre-charge phase, the logic low CLK signal turns off the evaluation transistor EVAL and turns on the pre-charge transistors PC1 and PC2. With the non-conducting evaluation transistor isolating nodes OUT1N and OUT2N from the low voltage rail (e.g., ground potential), the pre-charge transistors PC1 and PC2 quickly pre-charge respective nodes OUT1N and OUT2N toward the $V_{DD}$ rail. The resultant logic high levels at nodes OUT1N and OUT2N propagate through respective inverters INV6 and INV7, which in turn cause respective Q and $\overline{Q}$ output signals to be logic low during the pre-charge phase (see the timing diagram of FIG. 2). The logic high levels at nodes OUT1N and OUT2N maintain respective p-channel keeper transistors K1 and K2 in a non-conducting state, and also turn on respective shut-off transistors S1 and S2.

When the clock signal CLK transitions to logic high, the evaluation transistor EVAL turns on and discharges node CGND to logic low, thereby commencing the evaluation phase. The logic high clock CLK also turns off the pre-charge transistors PC1 and PC2. If the data signal D is logic high when the evaluation phase begins, the first input transistor N1 turns on while the second input transistor N2 turns off. Output node OUT1N discharges to logic low through transistors S1, N1 and EVAL, while the non-conducting input transistor N2 maintains output node OUT2N at logic high. The inverter INV6 inverts the logic low level at node OUT1N to drive the Q output signal to logic high, and the inverter INV7 inverts the logic high level at node OUT2N to keep the $\overline{Q}$ output signal at logic low. The logic low level at node OUT1N turns off the shut-off transistor S2 via inverters INV4 and INV5 to prevent the second input latch 13 from further data sampling. The logic low signal at node OUT1N also turns on transistor K1, which maintains node OUT2N at logic high to reduce charge loss.

Conversely, if the data signal D is logic low, the input transistor N1 turns off and thus does not discharge node OUT1N toward ground potential. The resulting logic high signal at node OUT1N is inverted by INV6 to drive the Q output signal to logic low. The logic low data signal D is inverted by INVL to generate a logic high complementary data signal $\overline{D}$, which turns on the second input transistor S2 to discharge the second output node OUT2N to logic low. In response thereto, the output latch 16 drives its $\overline{Q}$ output signal to logic high, as illustrated by the dashed $\overline{Q}$ waveform in FIG. 2. The logic low signal at node OUT2N turns off the shut-off transistor S2 via inverters INV3 and INV2 to prevent the first input latch 11 from further data sampling.

Although effective in eliminating the static flip-flop time penalty discussed above by providing Q and $\overline{Q}$ output signals that are compatible with dynamic logic, the complementary evaluation paths of the dynamic flip-flop circuit undesirably require duplicate circuitry. For example, sampling the data signal D to generate the Q output signal via node OUT1N and sampling the complementary data signal $\overline{D}$ to generate the $\overline{Q}$ output signal via node OUT2N requires two latches 11 and 13, and thus two evaluation paths, two shut-off circuits 12 and 14, and so on. Requiring duplicate circuitry undesirably increases circuit size and complexity, which in turn increases power consumption.

Further, using dual evaluation paths to generate dynamic logic-compatible output signals undesirably restricts implementation of multi-input logic functions in a dynamic flip-flop. For example, FIG. 4 shows the flip-flop circuit 10 modified to implement a 4-input logic AND function. Each of the input signals D0–D3 requires a corresponding series-connected input transistor N1 in the first input latch 11 to participate in the generation of the Q output signal, and also requires a corresponding parallel-connected input transistor N2 in the second input latch 13 to participate in the generation of the $\overline{Q}$ output signal. The series-connected input transistors N1(0)–N1(3) discharge node OUT1N toward ground potential, which in turn drives the Q output signal to logic high, only when all input signals D0–D3 are logic high to implement the AND logic function Q=D0•D1•D2•D3, where •0 is the logic AND function. For the complementary evaluation path, any one of the parallel-connected input transistors N2(0)–N2(3) may discharge node OUT2NN toward ground potential, which in turn drives the $\overline{Q}$ output signal to logic high, when any of the complementary input signals $\overline{D0}$–$\overline{D3}$ are logic high. This implements the complementary evaluation path of $\overline{Q}=\overline{D0}+\overline{D1}+\overline{D2}+\overline{D3}$, where + is the logic OR function.

Implementation of multiple-input logic functions using dual evaluation paths significantly increases circuit complexity and silicon area, since each input signal requires two input transistors N1(x) and N2(x) and an inverter INV1. Further, since each of the series-connected input transistors N1(0)–N1(3) increases the resistance of the discharge path from node OUT1N to ground potential, which in turn increases the time required to discharge node OUT1N, increasing the number of input signals undesirably degrades circuit performance. This results in an undesirable trade-off between the number of input signals and circuit performance. Accordingly, there is a need for a simpler dynamic flip-flop circuit that can also implement multiple-input logic functions without sacrificing circuit performance.

SUMMARY

A dynamic flip-flop circuit is disclosed that allows for implementation of multiple-input logic functions without sacrificing performance by using a single evaluation path to generate its output signals. In accordance with one embodiment of the present invention, the dynamic flip-flop circuit includes input logic that receives a clock signal and one or more data input signals. The clock signal defines the pre-charge phase and the evaluation phase of the flip-flop circuit. The input logic has an output terminal connected to a first output buffer circuit, which in turn drives the flip-flop circuit's Q output signal. The output terminal of the input logic is combined with the clock signal in a logic gate having an output terminal connected to a second output buffer circuit, which in turn drives the flip-flop circuit's complementary output signal $\overline{Q}$.

During the pre-charge phase, the input logic forces the Q output signal to a first logic state via the first output buffer, and the logic gate forces the $\overline{Q}$ output signal to the first logic state via the second output buffer. During the evaluation phase, the input logic generates a result signal in response to a predetermined logic function of its one or more input signals. The result signal generates the Q output signal via the first output buffer, and is complemented to generate the $\overline{Q}$ output signal via the second output buffer. By using a single evaluation path to generate the Q and $\overline{Q}$ output signals, circuit complexity is reduced over the prior art, particularly when implementing a logic function of multiple input signals.

BRIEF DESCRIPTION OF THE DRAWINGS

Like reference numerals refer to corresponding parts throughout the drawing figures.

DETAILED DESCRIPTION

Figure 5:
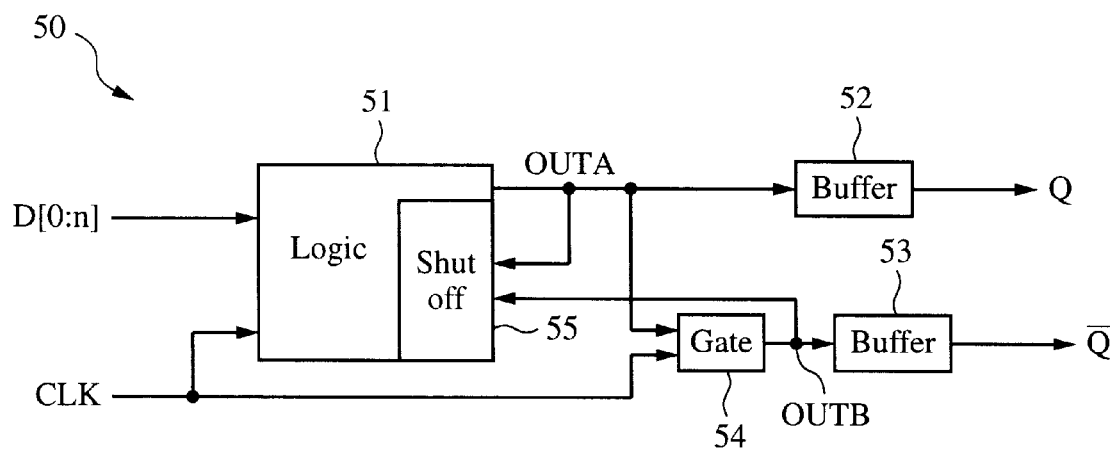
FIG. 5 is a block diagram of a dynamic flip-flop circuit in accordance with one embodiment of the present invention.

FIG. 5 is a block diagram of a dynamic flip-flop 50 circuit in accordance with the present invention. The dynamic flip-flop circuit 50 includes input logic 51, a first output buffer 52, a second output buffer 53, and a logic gate 54. The input logic 51 has a clock input terminal coupled to receive the clock signal CLK, an input element having one or more input terminals coupled to receive a corresponding one or more data input signals D[0:n], and an output terminal connected to the first output buffer 52 via node OUTA. The gate 54 has respective input terminals coupled to receive the result signal and the clock signal CLK, and has an output terminal connected to the second output buffer 53 at node OUTB. The logic 51 also includes a shut-off circuit 55 having input terminals connected to node OUTA and to node OUTB, as shown in FIG. 5. The shut-off circuit implements edge-triggered sampling of data signals D[0:n] by preventing the input logic 51 from further sampling after either node OUTA or node OUTB transitions logic states in response to the data signal(s).

During the pre-charge phase, the dynamic flip-flop circuit 50 forces its output signals Q and $\overline{Q}$ to a first logic state. During the evaluation phase, the input logic 51 samples the one or more data signals to generate a result signal at node OUTA. The first output buffer 52 generates the Q output signal in response to the result signal. The result signal is selectively complemented by the gate 54 to generate a complement of result signal at node OUTB. The second output buffer 53 generates the $\overline{Q}$ output signal in response to the complemented result signal at node OUTB.

Figure 6:
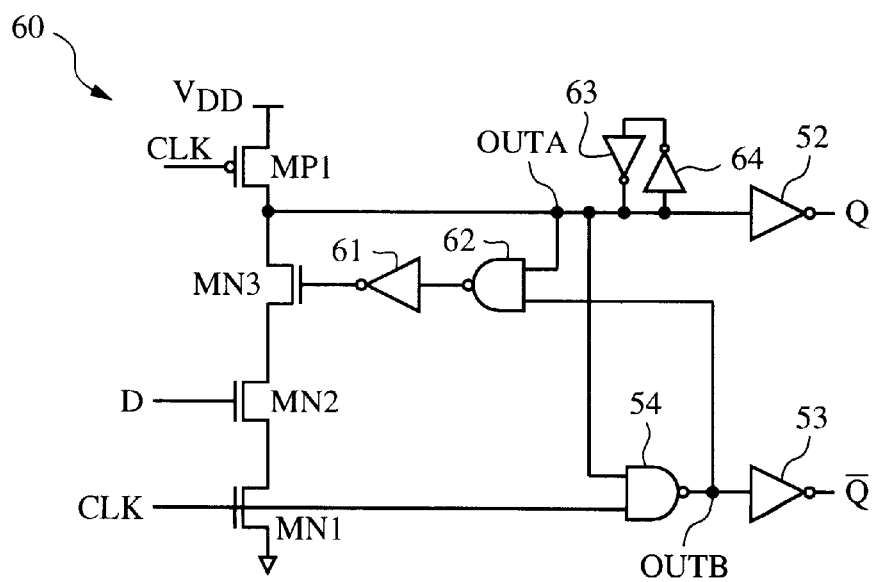
FIG. 6 is a schematic diagram of one embodiment of the dynamic flip-flop circuit of FIG. 5.

FIG. 6 is a schematic diagram of a dynamic flip-flop circuit 60 that is one embodiment of the flip-flop 50 of FIG. 5. Input logic 51 is implemented using a PMOS pre-charge transistor MP1, an NMOS evaluation transistor MN1, an NMOS input transistor MN2, an NMOS shut-off transistor MN3, inverter 61, and a NAND gate 62, where the input transistor MN2 implements the input element, and the shut-off transistor MN3, inverter 61, and NAND gate 62 implement the shut-off circuit 55. In the embodiment of FIG. 6, the buffers 52 and 53 are inverting buffers, and the gate 54 is a NAND gate, although other suitable circuitry may be used. The flip-flop circuit 60 also includes a latch formed by inverters 63 and 64 to latch the result signal at node OUTA.

The input transistor MN2 is connected between the evaluation transistor MN1 and the shut-off transistor MN3, and has a gate coupled to receive an input signal D. The evaluation transistor MN1 is connected between the input transistor MN2 and ground potential, and has a gate coupled to receive the clock signal CLK. The pre-charge transistor MP1 is connected between the supply voltage $V_{DD}$ and the result node OUTA, and has a gate coupled to receive the clock signal CLK. The shut-off transistor MN3 is connected between the input transistor MN2 and node OUTA, and has a gate coupled to receive a shut-off signal generated by the AND gate formed by NAND gate 62 and inverter 61 in response to the logic signals at nodes OUTA and OUTB.

Operation of the dynamic flip-flop circuit 60 is described with reference to the timing diagram in FIG. 7. During the logic low portion of each clock cycle, the flip-flop circuit 60 is in the pre-charge phase. The logic low clock signal CLK turns on the PMOS pre-charge transistor MP1, which in turn pulls node OUTA high toward the supply voltage $V_{DD}$. The logic low clock signal CLK also forces the NAND gate 54 to drive node OUTB to logic high. The logic high signals at nodes OUTA and OUTB are inverted by inverters 52 and 53 to generate logic low output signals Q and $\overline{Q}$, respectively.

The logic low clock signal CLK also turns off evaluation transistor MN1 to isolate node OUTA from ground potential. The logic high levels at nodes OUTA and OUTB drive the output of the NAND gate 62 to logic low, which in turn is inverted by the inverter 61 to reset the shut-off signal to logic high. In response thereto, the shut-off transistor MN3 turns on to enable sampling of the data signal D during the next evaluation phase.

On the rising edge of the clock signal CLK, the dynamic flip-flop circuit 60 enters the evaluation phase. The logic high clock CLK turns off the pre-charge transistor MP1 to isolate node OUTA from the supply voltage $V_{DD}$, and turns on the evaluation transistor MN1. The input transistor MN2 samples the data signal D, which is preferably valid before the evaluation phase begins, and in response thereto selectively discharges node OUTA to generate the result signal. The result signal is then used to generate the complementary output signals Q and $\overline{Q}$. As shown in FIG. 6, the result signal generates the Q output signal via the buffer 52, and the complemented result signal provided by the NAND gate 54 generates the $\overline{Q}$ output signal via the buffer 53.

Figure 7:
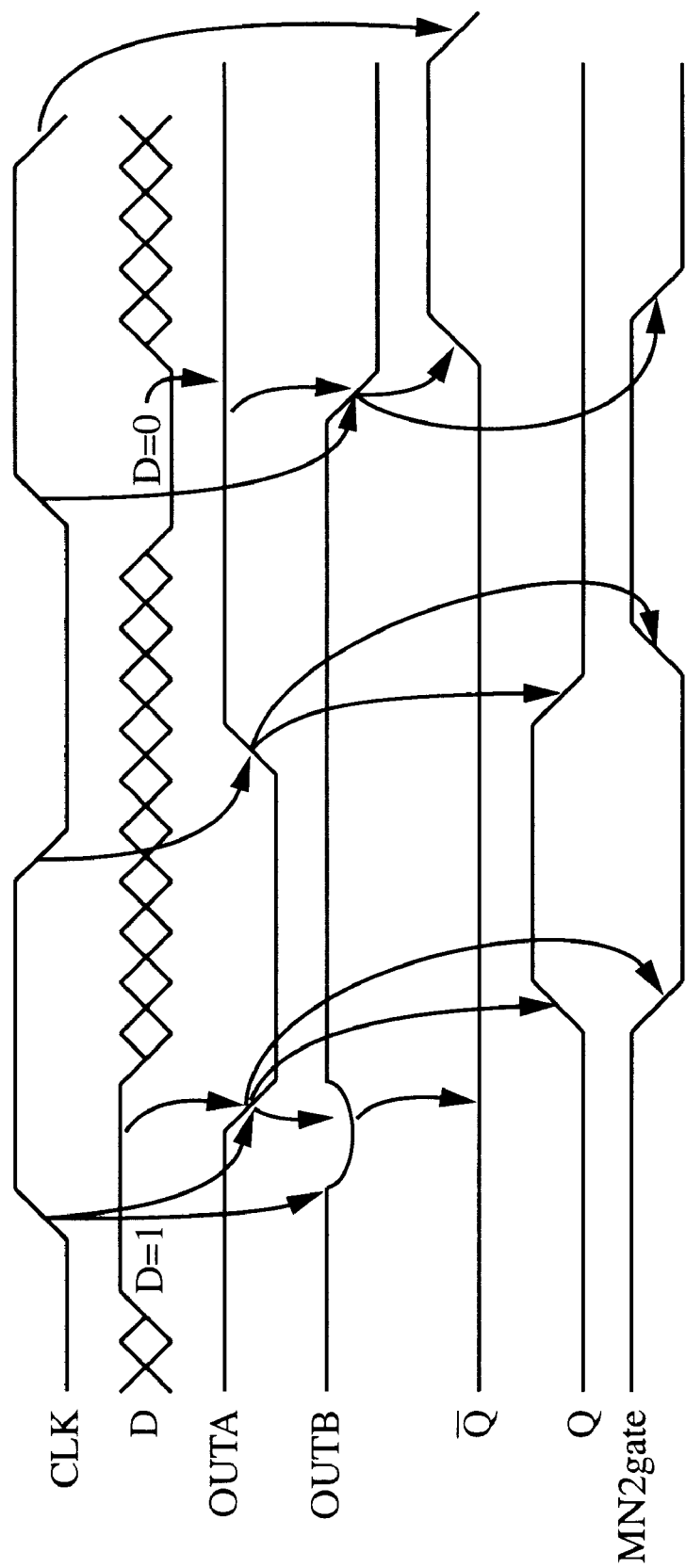
FIG. 7 is a timing diagram illustrating operation of the dynamic flip-flop circuit of FIG. 6.

For example, if the input signal D is logic high, as illustrated in FIG. 7 when D=1, the input transistor MN2 is conductive and discharges node OUTA toward ground potential to generate a logic low result signal, which is in turn is inverted by the inverter 52 to generate a logic high Q output signal. The result signal is complemented by the NAND gate 54 to drive node OUTB to logic high, which in turn is inverted by the inverter 53 to generate a logic low $\overline{Q}$ output signal. The logic low result signal at node OUTA also forces the output of the NAND gate 62 to logic high, which in turn sets the shut-off signal to logic low via the inverter 61. In response thereto, the shut-off transistor MN3 turns off and isolates the input transistor MN2 from logic output node OUTA. In this manner, the shut-off transistor MN3 prevents further sampling of the data signal D after the rising edge of CLK via the transitioning of either node OUTA or node OUTB to logic low. In some embodiments, the NAND gate 62, inverter 61, and the shut-off transistor MN3 may be omitted.

Conversely, if the data signal D is logic low, as illustrated in FIG. 7 when D=0, the input transistor MN2 is non-conductive, and therefore does not discharge node OUTA. In response to the logic high result signal at node OUTA, the inverting buffer 52 keeps the Q output signal at logic low. Since the clock signal CLK is in its logic high state, the NAND gate 54 complements the logic high result signal to generate a logic low signal at node OUTB, which in turn is inverted by the inverting buffer 53 to drive the $\overline{Q}$ output signal to logic high. The transition of node OUTB to logic low results in a logic high shut-off signal, which in turn causes the shut-off transistor MN3 to turn off and thus prevent further sampling of the data signal D.

In the embodiment shown in FIG. 6, the rising edge of the clock signal CLK, which defines the beginning of the evaluation phase, causes node OUTB to begin discharging toward ground potential via pull-down transistors within NAND gate 54 approximately one gate delay after CLK goes high (since NAND gate 54 is conventional, its internal architecture is not shown in FIG. 6 for simplicity). If the data signal D is logic high, the input transistor MN2 turns on and discharges node OUTA toward ground potential, which in turn causes the NAND gate 54 to re-charge node OUTB back toward $V_{DD}$ approximately one gate delay after node OUTA transitions to logic low, as illustrated in FIG. 7 when D=1. Conversely, if the data signal D is logic low, the input transistor MN2 does not turn on, and node OUTA is maintained in the logic high state. With both of its input signals in the logic high state, NAND gate 54 continues to discharge node OUTB toward ground potential, as illustrated in FIG. 7 when D=0.

The duration of the resultant voltage dip or glitch at node OUTB when D=1 is determined by the delay between node OUTB discharging toward ground potential via NAND gate 54 in response to CLK and node OUTA discharging to ground potential via transistors MN1, MN2, and MN3 in response to CLK and D. The faster that node OUTA transitions from logic high to logic low, the faster that NAND gate 54 transitions its output signal at node OUTB back to logic high. Thus, the transistors MN1, MN2, and MN3 are preferably sized to have a greater drive strength with respect to the pull-down transistors in NAND gate 54 so that node OUTA discharges toward ground potential via transistors MN1, MN2, and MN3 at a faster rate than node OUTB discharges toward ground potential via the pull-down transistors in NAND gate 54, thereby minimizing the glitch at node OUTB when D=1. In actual embodiments, different sizing ratios between the transistors MN1–MN3 and the pull-down transistors in NAND gate 54 may be used depending upon the extent to which the glitch at node OUTB when D=1 is desired to be reduced.

On the next falling edge of the clock signal CLK, the dynamic flip-flop circuit 60 again enters into the pre-charge phase and drives its Q and $\overline{Q}$ output signals to logic low via respective inverting buffers 52 and 53. The logic high states of nodes OUTA and OUTB are combined in the NAND gate 62 and then inverted by the inverter 61 to reset the shut-off signal to logic high. The shut-off transistor turns on to allow sampling of the data signal D during the next evaluation phase.

As described above, dual-rail dynamic flip-flop circuits of the present invention use a single evaluation path to generate the Q and $\overline{Q}$ output signals. This is in marked contrast to using dual evaluation paths to independently generate the Q and $\overline{Q}$ output signals, as disclosed for instance by Klass et al. Applicants' use of a single evaluation path to generate dynamic logic-compatible Q and $\overline{Q}$ output signals results in a simpler circuit design, which in turn reduces silicon area and power consumption. Using less silicon area and consuming less power allows present embodiments to be implemented using smaller semiconductor technologies.

Figure 8:
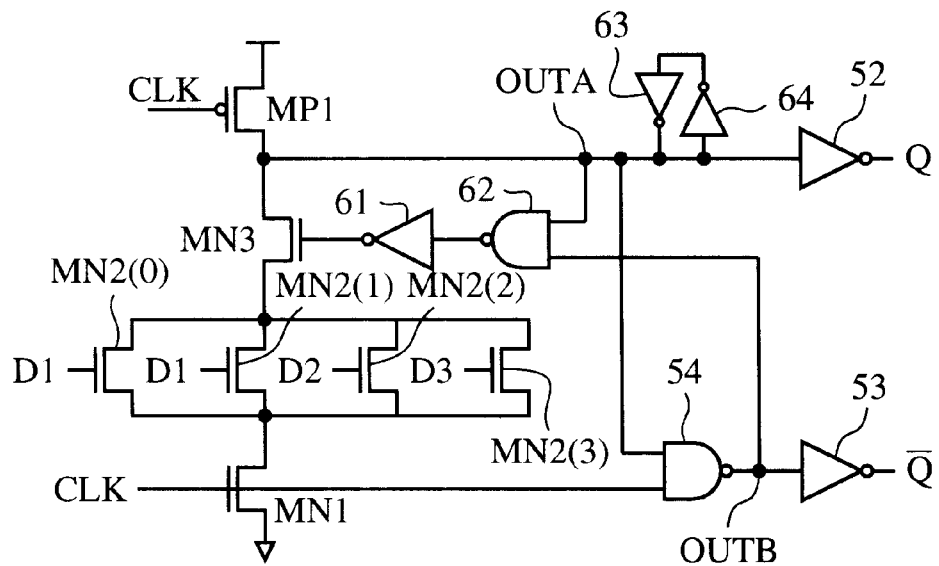
FIG. 8 is a schematic diagram of one embodiment of the dynamic flip-flop circuit of FIG. 5 configured to implement a logic OR/NOR function.

Further, present embodiments allow for the implementation of multiple-input logic functions within a dynamic flip-flop without sacrificing performance. For example, FIG. 8 shows a dynamic flip-flop circuit 80 that is one embodiment of the flip-flop circuit 50 of FIG. 5. The dynamic flip-flop circuit 80 is configured to implement a logic OR/NOR function of four input signals D0–D3. The dynamic flip-flop circuit 80 is similar in configuration and operation to the dynamic flip-flop circuit 60 of FIG. 6, except that instead of having a single input transistor MN2, the dynamic flip-flop circuit 80 includes four input transistors MN2(0)–MN2(3) connected in parallel between the evaluation transistor MN1 and the shut-off transistor MN3. Each of the input transistors MN2(0)–MN2(3) has a gate coupled to receive a corresponding one of the input data signals D0–D3.

During the evaluation phase, the input transistors MN2(0)–MN2(3) sample respective input signals D0–D3, and selectively discharge node OUTA in response to the logical OR combination of the signals D0–D3. Thus, if all of the input signals D0–D3 are logic low, none of the corresponding input transistors MN2(0)–MN2(3) are conductive, and the result node OUTA remains in the logic high state. In response thereto, the inverter 52 drives the Q output signal to logic low, and the NAND gate 54 drives, using the inverter 53, the $\overline{Q}$ output signal to logic high. Conversely, if one or more of the input signals D0–D3 are logic high, a corresponding one or more of the input transistors MN2(0)–MN2(3) turn on and discharge node OUTA toward ground potential. In response to the logic low result signal at node OUTA, inverter 52 drives the Q output signal to logic high, and NAND gate 54 drives node OUTB to logic high, which drives the $\overline{Q}$ output signal to logic low via inverter 53.

Figure 1:
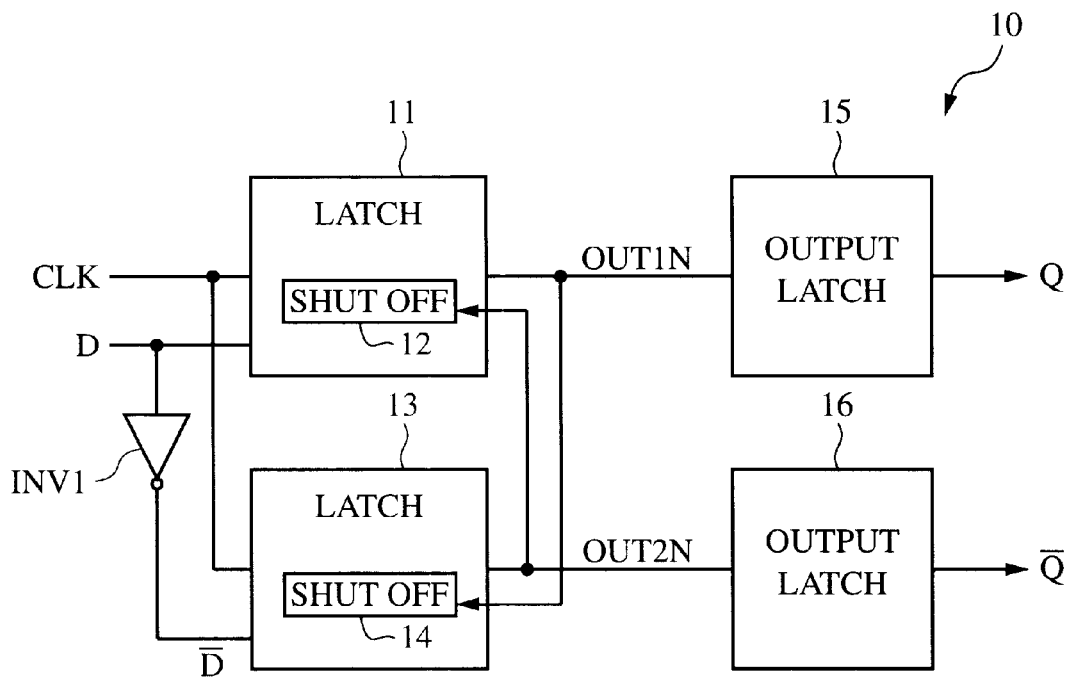
FIG. 1 is a block diagram of a conventional dynamic flip-flop circuit.
Figure 2:
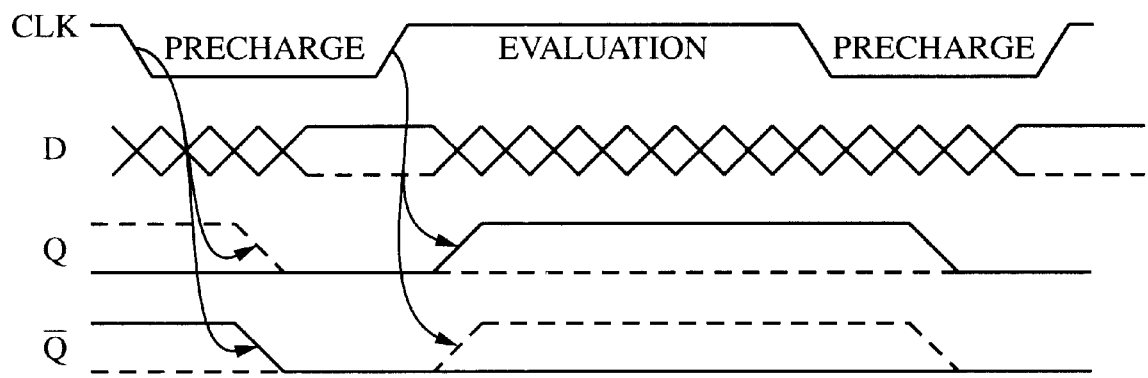
FIG. 2 is a timing diagram illustrating operation of the dynamic flip-flop circuit of FIG. 1.
Figure 3:
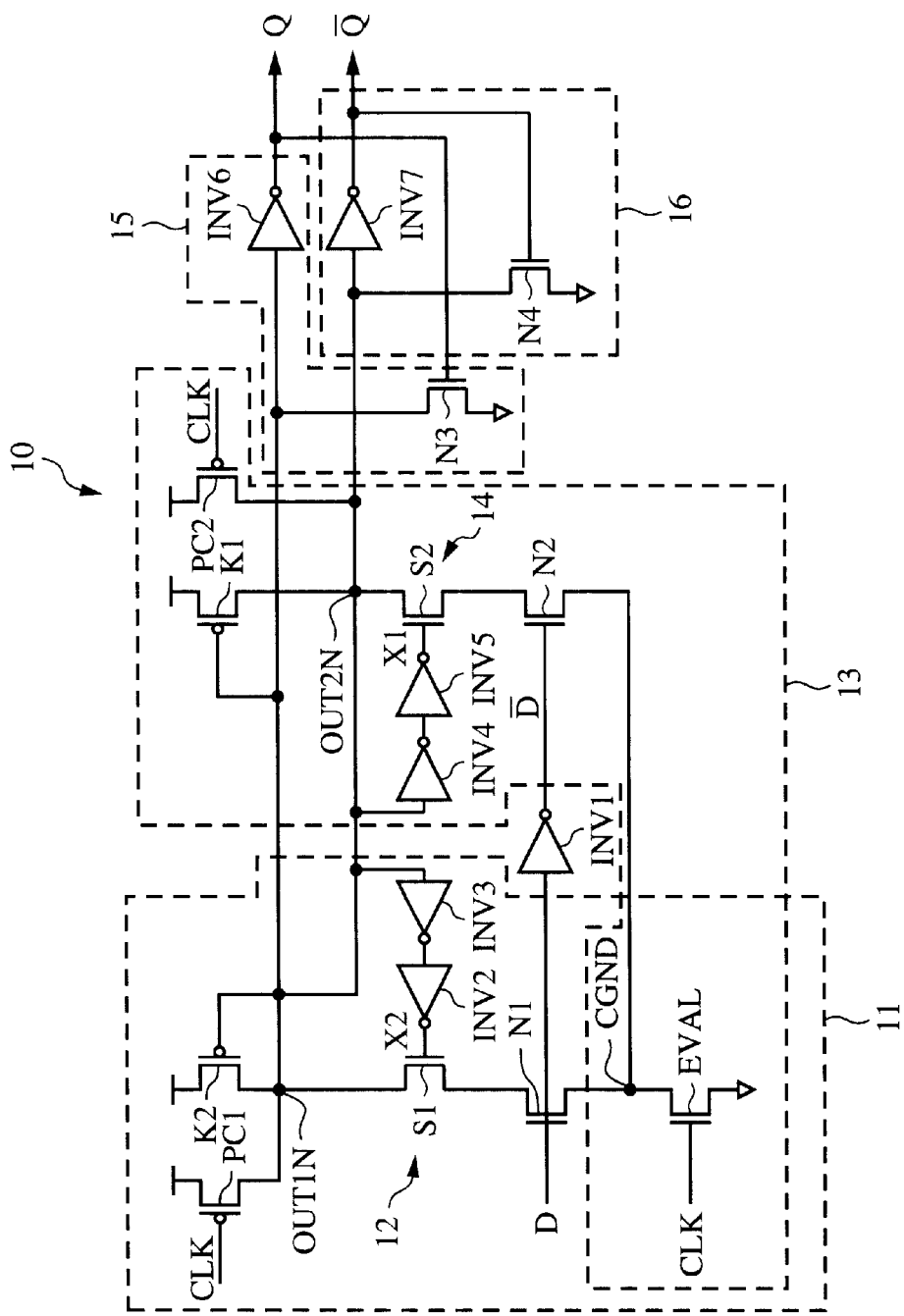
FIG. 3 is a schematic diagram of the dynamic flip-flop circuit of FIG. 1.
Figure 4:
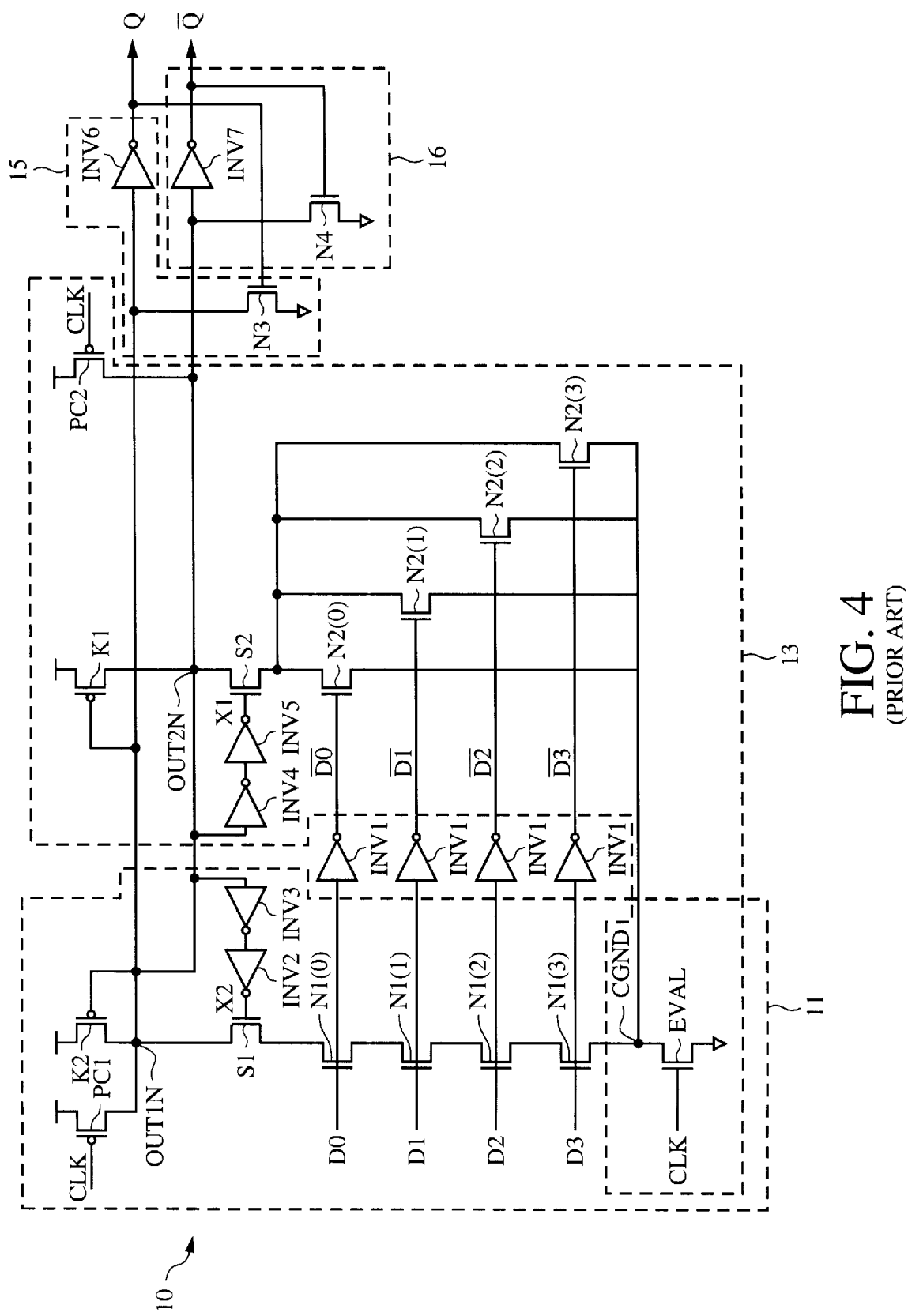
FIG. 4 is a schematic diagram of the circuit of FIG. 3 modified according to the prior art to implement a 4-input logic AND function.

Although shown in FIG. 8 as receiving four data signals D0–D3, other embodiments may receive a greater (or fewer) number of data signals by simply providing (or removing) additional input transistors MN3 connected in parallel with respect to one another and in series between the shut-off transistor MN3 and the evaluation transistor MN1. Thus, in marked contrast to the prior art circuit of FIG. 4, which requires multiple series-connected input transistors to implement the Q signal evaluation path and an additional set of multiple parallel-connected input transistors to implement the $\overline{Q}$ evaluation path, the dynamic flip-flop circuit 80 does not need a set of series-connected input transistors to generate an output signal. As a result, present embodiment may accommodate additional input signals without increasing the resistance of the discharge path between the result node OUTA and ground potential. This allows present embodiments to implement logic functions of multiple input signals without sacrificing performance and without significantly increasing circuit size and complexity. For example, in contrast to the prior art flip-flop circuit of FIG. 4, which requires four input transistors N1 connected in series between its shut-off transistor S1 and its evaluation transistor EVAL, in addition to the four parallel-connected transistors N2 between shut-off transistor S1 and evaluation transistor EVAL, the dynamic flip-flop circuit 80 includes a single input element connected in series between the shut-off transistor MN3 and the evaluation transistor MN1.

Figure 9:
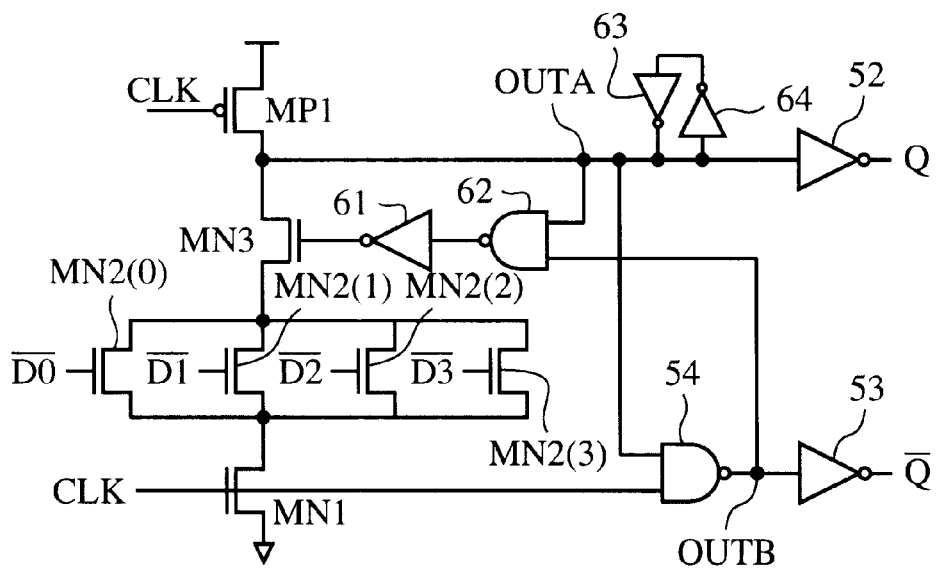
FIG. 9 is a schematic diagram of another embodiment of the dynamic flip-flop circuit of FIG. 5 configured to implement a logic NAND/AND function.

Dynamic flip-flops of the present invention may also implement a logic NAND/AND function of multiple-input signals. The dynamic flip-flop circuit 80 of FIG. 8 may be modified to implement the logic NAND/AND function of the four data signals D0–D3 by sampling the logical complements of respective input signals D0–D3. For example, FIG. 9 shows a dynamic flip-flop circuit 90 having the four NMOS input transistors MN2(0)–MN2(3) coupled to sample complementary inputs signals $\overline{D0}$–$\overline{D3}$. The complementary input signals $\overline{D0}$–$\overline{D3}$ may be generated in any suitable manner using, for instance, conventional CMOS inverters. If any of the complementary input signals $\overline{D0}$–$\overline{D3}$ are logic high, i.e., if any of signals D0–D3 are logic low, the result node OUTA is discharged during the evaluation phase, which in turn generates a logic high Q output signal and a logic low $\overline{Q}$ output signal. Conversely, if all of the complementary input signals $\overline{D0}$–$\overline{D3}$ are logic low, i.e., if all of signals D0–D3 are logic high, the result node OUTA is not discharged during the evaluation phase, which in turn generates a logic low Q output signal and a logic high $\overline{Q}$ output signal. Accordingly, the embodiment of FIG. 9 implements the logic function $Q=\overline{D0}+\overline{D1}+\overline{D2}+\overline{D3}=\overline{D0 \cdot D1 \cdot D2 \cdot D3}$. Thus, the Q output signal provides the logic NAND function of the four input signals D0–D3, and the $\overline{Q}$ output signal provides the logic AND function of the four input signals D0–D3.

In other embodiments, the input element may include a plurality of input transistors connected in series between the result node OUTA and the evaluation transistor MN1. To implement the logic AND/NAND function, the gates of the series-connected input transistors are coupled to receive the data signals D, where $Q=\overline{D0 \cdot D1 \cdot D3 \cdot D4}$. To implement the logic NOR/OR function, the gates of the series-connected input transistors are coupled to receive complements of the data signals D, where $Q=\overline{\overline{D0} \cdot \overline{D1} \cdot \overline{D2} \cdot \overline{D3}}=D0+D1+D2+D3$. Although using series-connected input transistors results in a higher series resistance for the discharge path from node OUTA to ground potential, as compared to embodiments having parallel-connected input transistors, the single evaluation path architecture of present embodiments nevertheless allows for a simpler circuit than prior art multiple-input dynamic flip-flops.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A dynamic flip-flop having a single evaluation path to generate first and second output signals that are compatible with dynamic logic, the flip-flop comprising:
    input logic having a first input terminal coupled to receive a clock signal defining a pre-charge phase and an evaluation phase of operation, a second input terminal coupled to receive a data signal, and an output terminal to provide a result signal in response the data signal;
    a first buffer having an input terminal coupled to receive the result signal and an output terminal to provide the first output signal;
    a second buffer having an input terminal coupled to selectively receive a complement of the result signal and an output terminal to provide the second output signal; and
    a gate connected between the input logic and the second buffer to provide the complement of the result signal to the second buffer,
        wherein during the pre-charge phase the first and second buffers drive their respective first and second output signals to a first logic state, and during the evaluation phase, the first buffer selectively transitions the first output signal to a second logic state in response to the result signal and the second buffer selectively transitions the second output signal to the second logic state in response to the complement of the result signal.

2. The dynamic flip-flop circuit of claim 1, wherein the first and second buffers are inverting buffers.

3. The dynamic flip-flop circuit of claim 1, wherein the gate comprises a NAND gate having a first input terminal coupled to receive the result signal, a second input terminal coupled to receive the clock signal, and an output terminal coupled to selectively provide the complement of the result signal to the second buffer in response to the clock signal.

4. The dynamic flip-flop circuit of claim 1, wherein the input logic comprises:
    a pre-charge transistor connected between a voltage supply and the output terminal of the input logic and having a gate coupled to receive the clock signal;
    an input element having a first terminal connected to the output terminal of the input logic and a gate coupled to receive the data signal; and
    an evaluation transistor connected between the input transistor and ground potential and having a gate coupled to receive the clock signal.

5. The dynamic flip-flop circuit of claim 4, wherein the input element comprises a plurality of input transistors connected in parallel with each other between the pre-charge transistor and the evaluation transistor and having gates coupled to receive a plurality of data signals.

6. The dynamic flip-flop circuit of claim 5, wherein the result signal comprises a logical AND combination of the plurality of data signals.

7. The dynamic flip-flop circuit of claim 5, wherein the result signal comprises a logic OR combination of the plurality of data signals.

8. The dynamic flip-flop circuit of claim 4, wherein the input logic includes a shut-off circuit to implement edge-triggered data sampling in response to the result signal.

9. The dynamic flip-flop circuit of claim 8, wherein the shut-off circuit comprises:
    a logic gate having input terminals connected to respective input terminals of the first and second buffers and an output terminal to provide a shut-off signal; and
    a shut-off transistor connected in series between the pre-charge transistor and the input element and having a gate responsive to the shut-off signal.

10. The dynamic flip-flop circuit of claim 9, wherein the logic gate comprises a NAND gate connected in series with an inverting buffer.

11. A dynamic flip-flop circuit operating in a pre-charge phase and an evaluation phase to provide first and second output signals, comprising:

input logic having a first input terminal coupled to receive a clock signal, a second input terminal coupled to receive one or more data signals, and a first output terminal to generate a result signal indicative of a logical combination of the one or more data signals, the input logic comprising:
- a pre-charge transistor connected between a voltage supply and the output terminal of the input logic and having a gate coupled to receive the clock signal;
- an evaluation transistor connected to ground potential and having a gate coupled to receive the clock signal; and
- one or more input transistors connected between the pre-charge transistor and the evaluation transistor, the one or more input transistors having respective gates coupled to receive the one or more data signals;

a first buffer coupled to receive the result signal, the first buffer driving the first output signal to a first logic state during the pre-charge phase and selectively transitioning the first output signal to a second logic state in response to the logical combination of the one or more data signals;

a second buffer coupled to receive a complement of the result signal, the second buffer driving the second output signal to the first logic state during the pre-charge phase and selectively transitioning the second logic signal in response to the complement of the result signal during the evaluation phase; and a shut-off circuit responsive to the result signal to implement edge-triggered data sampling.

12. The dynamic flip-flop circuit of claim 11, wherein the plurality of input transistors are connected in parallel with one another between the pre-charge transistor and the evaluation transistor.

13. The dynamic flip-flop circuit of claim 11, wherein the plurality of input transistors are connected in series with one another between the pre-charge transistor and the evaluation transistor.

14. The dynamic flip-flop circuit of claim 11, wherein the shut-off circuit comprises:

- a logic gate having input terminals connected to respective input terminals of the first and second buffers and an output terminal to provide a shut-off signal; and
- a shut-off transistor connected in series between the pre-charge transistor and the one or more input transistors and having a gate responsive to the shut-off signal.

15. A method of implementing a dynamic flip-flop operating in a pre-charge phase and an evaluation phase defined by a clock signal, comprising:

driving first and second output signals to a first logic state during the pre-charge phase;

sampling one or more data signals during a transition between the pre-charge phase and the evaluation phase;

selectively transitioning the first output signal to a second logic state during the evaluation phase in response to the sampling of the one or more data signals;

complementing the first output signal during the evaluation phase to generate the second output signal; and combining the first and second output signals to generate a shut-off signal that prevents further sampling of the one or more data signals.

* * * * *